Sept. 10, 1963 H. W. HENKELS 3,103,599

INTEGRATED SEMICONDUCTOR REPRESENTING THREE CASCADED TRANSISTORS

Filed July 26, 1960

INVENTOR.
HERBERT W. HENKELS
BY
Frederick Shapoe
ATTORNEYS

United States Patent Office 3,103,599

Patented Sept. 10, 1963

3,103,599

INTEGRATED SEMICONDUCTOR REPRESENTING THREE CASCADED TRANSISTORS

Herbert W. Henkels, Rockwood, Pa., assignor to Westinghouse Electric Corporation, East Pittsburgh, Pa., a corporation of Pennsylvania Filed July 26, 1960, Ser. No. 45,393
8 Claims. (Cl. 307—88.5)

This invention relates to unitary, multifunctional semiconductor devices characterized by internal cascading and high beta gain.

In the copending application of Henkels and Nowalk, Serial No. 11,686, filed Feb. 29, 1960, there is disclosed novel semiconductor devices characterized by high gain and internal cascading. Those devices are particularly advantageous in that they are easily prepared, provide greater reliability and are less expensive than the multiple semiconductor structures made from individual units that would provide equivalent or comparable current gain and that would be necessary to perform the functions.

It is an object of the present invention to provide a novel semiconductor device that is the equivalent of three interconnected single devices, yet is a simple structure that is internally cascaded and is capable of performing a plurality of functions, and that can be fabricated with known commercial techniques with high reliability.

Semiconductor devices according to the present invention include the basic structure, as to the relative conductivity characteristics of various zones of a semiconductor body, disclosed in the copending Henkels and Nowalk application above-identified. In addition, there is provided what may be denominated a base drive semiconductor. These are combined into a single structure and in this general manner, a very high gain unit is provided with all the advantages characteristic of the device with but two internally cascaded semiconductors.

The invention will be most readily understood upon considering its detailed description along with the attached drawings in which.

Figure 1:
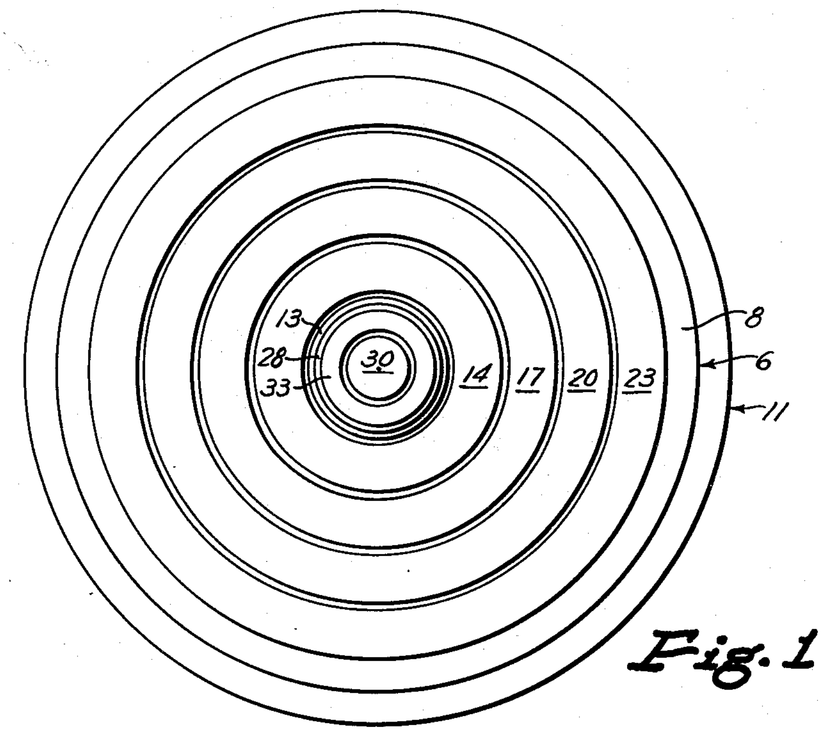
FIG. 1 is a top plan view of a semiconductor device, such as a transistor of this invention.
Figure 2:
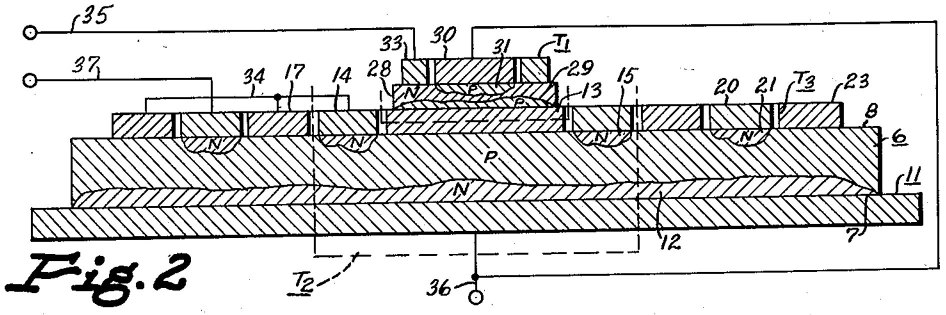
FIG. 2 is a schematic representation of the device of FIG. 1, showing the relative conductivity zones therein.

Referring now to FIGURES 1 and 2, the numeral 6 indicates a semiconductor wafer that is doped with conductivity impurities to characterize it as one conductivity type. On its lower surface 7 is a collector foil electrode 11 comprising a metal containing impurities of a conductivity type opposite to those in the semiconductor wafer 6; this electrode upon fusion forms, in the wafer, a zone or area 12 of opposite conductivity type semiconductor material. Accordingly, a P-N junction is produced in the semiconductor material adjacent the collector foil electrode 11. The collector electrode generally is relatively large, as shown, to dissipate the large amount of heat developed as a consequence of the high currents involved in some uses of the device.

Centrally located on the other surface 8 of the wafer is a first base electrode 13 in ohmic or non-rectifying contact with the semiconductor wafer 6. A first ring-shaped emitter electrode 14 forming a zone 15 of opposite conductivity type semiconductor material in the wafer 6 is spaced about the first base electrode 13. Hence, a second P-N junction is provided. A first ring-shaped base electrode 17 in ohmic or non-rectifying contact with the semiconductor wafer 6 is disposed about the emitter electrode 14. A second ring-shaped emitter electrode 20 is spaced about the first ring-shaped base electrode 17 and comprises a metal containing conductivity determining impurities of the type in emitter 14; electrode 20 forms a zone 21 in wafer 6 of conductivity type semiconductor material opposite to that of the main portion of the wafer. This provides the third P-N junction of the device. Finally, a second ring-shaped base electrode 23 is disposed around the second emitter 20 and is in ohmic or non-rectifying contact with the semiconductor wafer 6.

The structure so far disclosed is essentially that of the Henkels and Nowalk application above-identified. In accordance with this latter application, 14, 17 and 23 are electrically connected by a bridging electrode 34. The remaining parts comprise those that are included over and above those of the basic structure.

A second wafer 28 of semiconductor material is located on the upper surface of the first base electrode 13. This body of semiconductor material is of a conductivity type opposite to that of the semiconductor wafer 6 and base electrode 13. Consequently, upon fusion, a zone 29 of conductivity type opposite to that of semiconductor wafer 28 is provided therein, and thus the structure has its fourth P-N junction. Centrally located on the upper surface of this semiconductor body is a central emitter electrode 30 comprising a metal containing conductivity type impurities opposite to those in semiconductor body 28. This electrode forms a zone 31 in wafer 28 of conductivity type semiconductor material opposite to that of the main portion of wafer 28. The fifth P-N junction is thus provided. A ring-shaped base electrode 33 is spaced about the central emitter foil 30 and is in non-rectifying contact with the semiconductor wafer 28.

Current is supplied to the device across lead 35 to the base electrode 33, and the lead 36 to the common electrode 11. The output is taken through a lead 37 from the second ring-shaped emitter 20 and lead 36 from collector electrode 11. An external bridge connection 39 joins the central emitter electrode 30 with the common collector electrode 11.

Figure 3:
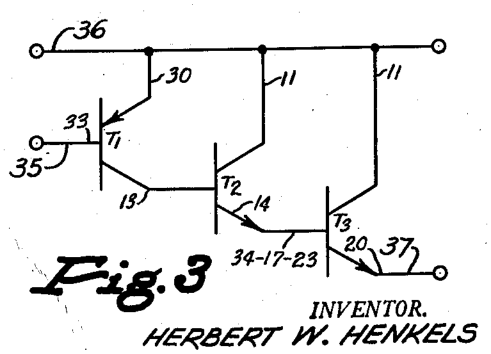
FIG. 3 shows the equivalent diagram of the device in accordance with FIG. 2.
Figure 4:
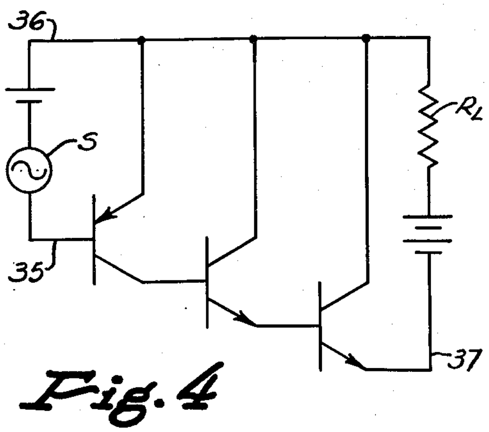
FIG. 4 shows a manner by which the device of FIGS. 1 and 2 can be used in a circuit as an amplifier.

Consideration of FIG. 3 shows the internal cascading in the device shown to achieve the functions of three transistors $T_1$, $T_2$ and $T_3$ which are provided by the like designated portions of FIG. 2. It is apparent that the structure shown is of PNP-NPN-NPN type, though it could as easily be NPN-PNP-PNP if desired. FIG. 4 shows one circuit in which the resulting structure is utilized as an amplifier, where $R_L$ indicates a load and S a signal to the unit.

The net effect of the structure on reliability is apparent. The mere provision of the structure of and by itself interconnects the units that comprise it. Accordingly, there is a diminished need for external circuitry, that could include impedances, capacitances, and the like. Where such structures must be provided, it is apparent that high precision fabrication that can only be accomplished with expensive materials and labor would be required. To provide such materials would, of course, introduce numerous additional elements, as just stated, and each element would multiply the sources of breakdown of the structure. Accordingly, by the structure of this invention, not only is a less expensive device provided to carry out a specific group of functions, but it is also provided in a manner that inherently brings about an increase in reliability and a decrease in costs.

An example of a specific device, such as a transistor, in accordance with the present invention is as follows: Collector electrode 11, emitter electrodes 14, 20 and base electrode 33 as well as base electrodes 13, 17, 23 and emitter 30 are made from gold foils on the order of 0.0015 inch thick. The collector foil 11 suitably is circular with a diameter of 0.551 inch. The silicon wafer 6 can be boron doped and be characterized with properties such as a (111) orientation, a 50 to 150 ohm-cm. resistivity and a 200 microseconds lifetime. Typical dimensions of such a wafer are 0.0043 inch thick and a diameter of 0.500 inch. The first base electrode 13 is circular and can have a diameter of 0.110 inch. The emitter electrode 14 has an inside diameter of 0.119 inch and an outside diameter of 0.188 inch. Base electrode 17 has an inside diameter of 0.197 inch and an outside diameter of 0.276 inch. The second ring-shaped emitter electrode 20 has an inside diameter of 0.285 inch and an outside diameter of 0.363 inch. The second ring-shaped base electrode 23 has an inside diameter of 0.372 inch and an outside diameter of 0.449 inch. The second silicon wafer 28 is generally circular and has a diameter of 0.108 inch. It can be doped with antimony or other impurity to characterize it opposite to the conductivity of wafer 6. Otherwise its characteristics are generally parallel to those of the silicon wafer 6. Emitter electrode 30 is generally circular with a diameter of 0.095 inch. Base electrode 33 can have an inside diameter of 0.100 inch and an outside diameter of 0.106 inch. Base electrodes 13, 17 and 23 as well as emitter electrode 30 all are made from gold containing 0.3 weight percent of boron. Collector electrode 11, emitter electrodes 14 and 20 and base electrode 33 have a nominal composition of 0.6 percent of antimony and the remainder gold.

The structure is formed by placing the silicon wafer 6 on the collector electrode 11 and then arranging the base electrodes 13, 17 and 23 as well as the emitter electrodes 14 and 20 on the upper surface of the silicon wafer. With these units in place, the second silicon wafer 28 is placed on the upper surface of base electrode 13. The structure is completed by adding base electrode 33 and emitter electrode 30 to the upper surface of the silicon wafer 28. The electrodes are placed in a mold conforming to its general configuration and heated at about 700° C. to fuse the electrodes to the silicon wafers. After holding the temperature for about 2 minutes, the sandwich was permitted to cool to room temperature. The leads can be made to the resulting structure by brazing gold plated silver wires thereto at a temperature of about 400° C.

Experience has demonstrated that heating conditions as just described suffice to fuse the various electrodes and semiconductor materials. This forms junctions in the semiconductor wafers as a consequence of appropriate impurity-rich alloy melts forming, and zones of impurity rich semiconductor material freeze out in the usual manner. It will be appreciated that the impurity concentrations in the electrode and semiconductor wafers are adapted to provide the desired conductivity type in the zones adjacent each electrode.

In devices of this invention, for example as set forth in the example above and used as a transistor, a current gain of about 10 in the last stage and of about 30 to 50 in each of the first and second stages results in an overall current gain of from 9000 to 25,000 ($\beta$). For example, in actual tests of the cascaded second and third stages, gains of 2000 at one ampere have been achieved repeatedly. The very high gain power transistors of the invention are of particular use for audio frequency applications. For example, they can be used in regular and high fidelity record players, as well as in voice circuits of television receivers and the like.

From the foregoing disclosure and discussion, it is evident that unique semiconductor devices incorporating molecular engineering concepts are provided by this invention. Variations from the detailed disclosure can be made within the scope of the invention. For example, shapes other than ring and circular configurations can be used. Where decreased emitter edge length can be tolerated, the second ring-shaped base electrode, or its equivalent structure, can be omitted. Moreover, the particular conductivity zones and characteristics, and consequently, their associated junctions, may be provided otherwise than by fusion, for example by diffusion.

In accordance with the provision of the patent statutes, the present invention has been illustrated and described with what is now conceived to represent its best embodiment. However, it should be understood that the invention can be practiced otherwise than as specifically described and illustrated.

I claim as my invention:

1. A semiconductor device comprising a body of semiconductor material of one conductivity type having opposed major surfaces, a first zone of opposite conductivity type within said body and extending to one of said major surfaces, second and third zones of opposite conductivity type within said body spaced from one another and extending to the other major surface, an electrode in non-rectifying contact with said body of semiconductor material, a second body of semiconductor material of opposite conductivity type on said electrode, said electrode forming a rectifying contact with said second body, and another zone of said one conductivity type in said second body of semiconductor material, the interfaces between said respective zones of one conductivity type semiconductor material and zones of opposite conductivity type semiconductor material comprising rectifying junctions.

2. A high gain ($\beta$) semiconductor comprising a body of semiconductor material of one conductivity type, said body having opposed major surfaces, a zone of opposite conductivity type along one of said major surfaces, a second zone of said opposite conductivity type generally centrally located in the other major surface of said body of semiconductor material, said second zone in said other surface defining a specified area, in said specified area a zone of said one conductivity type semiconductor material, third and fourth zones of said opposite conductivity type spaced from one another and from said second zone in said other surface of said semiconductor body, an electrical lead in non-rectifying contact with one of said zones of opposite conductivity type semiconductor material, a lead in non-rectifying contact with one of said third and fourth zones, and a connection in non-rectifying contact with the other of said third and fourth zones and with a zone on said other surface of said body of semiconductor material which zone is of said one conductivity type.

3. A semiconductor device comprising a body of semiconductor material of one conductivity type having opposed major surfaces, an electrode containing opposite type conductivity determining impurities fused to one of said surfaces and producing in said body a fused rectifying junction, two electrodes containing opposite type conductivity determining impurities spaced from one another and fused to the other of said major surfaces and each producing in said body a fused rectifying junction, an electrode containing said one conductivity type impurities fused in non-rectifying contact with said other surface of said body, a wafer of opposite type conductivity semiconductor material fused to electrode of one conductivity type and producing in said wafer a fused rectifying junction, an electrode containing said one conductivity determining impurities fused to the surface of said wafer and producing therein a fused rectifying junction, electrical leads to two of said electrodes that are in rectifying contact with said body of semiconductor material and an electrical lead in non-rectifying contact with a surface of said wafer.

4. A semiconductor device comprising, (1) a first region having a first type of semiconductivity, said first region having a top and a bottom surface, a second region having a second type of semiconductivity contiguous and coextensive with the bottom surface of said first region, a P-N junction between said first and said second regions, a first ohmic contact disposed substantially centrally upon the top surface of said first region and having one surface joined thereto in non-rectifying contact, a second ohmic contact disposed along substantially the peripheral edge of the top surface of said first region, a third ohmic contact, annular in configuration disposed between said first and said second ohmic contacts on the top surface of said first region, a first annular emitter disposed on the top surface of said first zone between said first and said third ohmic contact, a P-N junction between said first emitter and said first region, a second annular emitter disposed on the top surface of said first zone between said second and said third ohmic contacts, a P-N junction between said second emitter and said first zone, a body of a semiconductor material joined in non-rectifying contact to the opposite surface of said first ohmic contact, said body being comprised of a region of first type semiconductivity and a region of second type semiconductivity, a P-N junction between said regions, said regions terminating at opposite surfaces of the body, the side of the wafer joined to said first ohmic contact being the surface at which the region of first type semiconductivity terminates, an annular ohmic contact disposed along substantially the peripheral edge of the other surface of the body, and an emitter disposed substantially centrally on said other surface of the body and forming a P-N junction therewith.

5. A semiconductor device comprising, (1) a first region having a first type of semiconductivity, said first region having a top and a bottom surface, a second region having a second type of semiconductivity contiguous and coextensive with the bottom surface of said first region, a P-N junction between said first and said second regions, a first ohmic contact disposed substantially centrally upon the top surface of said first region and having one surface joined thereto in non-rectifying contact, a second ohmic contact disposed along substantially the peripheral edge of the top surface of said first region, a third ohmic contact, annular in configuration disposed between said first and said second ohmic contacts on the top surface of said first region, a first annular emitter disposed on the top surface of said first zone between said first and said third ohmic contact, a P-N junction between said first emitter and said first region, a second annular emitter disposed on the top surface of said first zone between said second and said third ohmic contacts, a P-N junction between said second emitter and said first zone, a body of a semiconductor material joined in non-rectifying contact to the opposite surface of said first ohmic contact, said body being comprised of a region of first type semiconductivity and a region of second type semiconductivity, a P-N junction between said regions, said regions terminating at opposite surfaces of the body, the side of the wafer joined to said first ohmic contact being the surface at which the region of first type semiconductivity terminates, an annular ohmic contact disposed along substantially the peripheral edge of the other surface of the body, an emitter disposed substantially centrally on said other surface of the body and forming a P-N junction therewith, and an electrical contact between said second and said third ohmic contacts and said first emitter.

6. A semiconductor device comprising three cascaded transistors, two of said transistors being contained within a unitary block of semiconductor material and having a common base region and a common collector region, the third transistor being comprised of a second body of a semiconductor material and being electrically connected to the common base region of the first two transistors by a single alloy foil member in non-rectifying ohmic contact with the common base region of said first two transistors and in rectifying contact with said second body of semiconductor material to form the collector region of said third transistor.

7. A semiconductor device capable of functioning as a three stage amplifier comprising three cascaded transistors, two of said transistors being contained within a unitary block of semiconductor material and having a common base region and a common collector region, the third transistor being comprised of a second body of a semiconductor material and being electrically connected to the common base region of the first two transistors by a single alloy foil member in non-rectifying ohmic contact with the common base region of said first two transistors and in rectifying contact with said second body of semiconductor material to form the collector region of said third transistor, a signal source and a D.C. power source connected across the emitter and base region of the third transistor, an impedance and a D.C. power source connected across the emitter and collector region of one of said two transistors, the emitter region of said third transistor being connected to the collector regions of said two transistors, the collector of the third transistor being connected to the base regions of the other of said two transistors, and the emitter region of said other transistor being connected to the base region of said one transistor.

8. A semiconductor device comprising three cascaded transistors, two of said transistors being contained withing a unitary block of semiconductor material and having a common base region and a common collector region, the third transistor being comprised of a second body of a semiconductor material and being electrically connected to the common base region of the first two transistors by a single alloy foil member in non-rectifying ohmic contact with the common base region of said first two transistors and in rectifying contact with said second body of semiconductor material to form the collector region of said third transistor, means for applying an input signal across the base and emitter regions of said third transistor, and means for obtaining an output signal from across the emitter and collector regions of one of said two transistors.

References Cited in the file of this patent

UNITED STATES PATENTS 2,897,295 Zelinka ---------------- July 28, 1959

FOREIGN PATENTS 208,405 Austria ---------------- Apr. 11, 1960